(12) United States Patent
Zhang

(10) Patent No.: US 10,581,021 B2
(45) Date of Patent: Mar. 3, 2020

(54) DISPLAY SUBSTRATE, MANUFACTURING METHOD THEREOF, AND DISPLAY PANEL

(71) Applicant: BOE TECHNOLOGY GROUP CO., LTD., Beijing (CN)

(72) Inventor: Wei Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/333,472

(22) Filed: Oct. 25, 2016

(65) Prior Publication Data
US 2017/0256750 A1    Sep. 7, 2017

(30) Foreign Application Priority Data

Mar. 4, 2016 (CN) .......................... 2016 1 0125517

(51) Int. Cl.
*H01L 51/56*    (2006.01)
*H01L 51/52*    (2006.01)
*H01L 27/32*    (2006.01)

(52) U.S. Cl.
CPC ...... *H01L 51/5275* (2013.01); *H01L 27/3211* (2013.01); *H01L 51/56* (2013.01)

(58) Field of Classification Search
CPC . H01L 51/5275; H01L 51/5268; H01L 33/52; H01L 33/54; H01L 33/56; H01L 33/58; H01L 51/56; G02F 1/133606
See application file for complete search history.

(56) References Cited

U.S. PATENT DOCUMENTS

| 8,969,896 B2* | 3/2015 | Ikeda ...................... H01L 51/00 257/40 |
| 2005/0274969 A1 | 12/2005 | Suzuki |

(Continued)

FOREIGN PATENT DOCUMENTS

| CN | 1721926 A | 1/2006 |
| CN | 1967899 A | 5/2007 |

(Continued)

OTHER PUBLICATIONS

The Second Chinese Office Action dated Oct. 31, 2018; Appln. No. 201610125517.2.

(Continued)

*Primary Examiner* — Tucker J Wright
*Assistant Examiner* — Scott Stowe

(57) ABSTRACT

A display substrate, a manufacturing method thereof, and a display panel are disclosed. The display substrate includes a glass substrate; plural sub-pixels; and plural light extraction modules disposed on the glass substrate at plural regions in one-to-one correspondence with the plural sub-pixels; wherein each of the light extraction modules has a hemisphere-shaped groove structure. By manufacturing the plural light extraction modules each having a hemisphere structure and a higher refractive index on the glass substrate in one-to-one correspondence with the plural sub-pixels, the refraction angle of the light that is emitted from each of the sub-pixels and incident onto the glass substrate can be decreased, so that more light can be emitted out; in this way, it is possible to improve the luminous efficiency of the display substrate and hence the display effect of the display device.

8 Claims, 5 Drawing Sheets

(56) References Cited

U.S. PATENT DOCUMENTS

| | | | |
|---|---|---|---|
| 2011/0109818 A1* | 5/2011 | Uneda | G02F 1/133526 |
| | | | 349/5 |
| 2012/0097991 A1 | 4/2012 | Ikeda et al. | |
| 2012/0218173 A1 | 8/2012 | Ohta et al. | |
| 2012/0292652 A1 | 11/2012 | Yamae et al. | |
| 2014/0361264 A1 | 12/2014 | Choi et al. | |
| 2015/0177427 A1 | 6/2015 | Morinaka et al. | |
| 2015/0380688 A1* | 12/2015 | Chen | H01L 51/5275 |
| | | | 257/40 |

FOREIGN PATENT DOCUMENTS

| | | |
|---|---|---|
| CN | 102293052 A | 12/2011 |
| CN | 102714894 A | 10/2012 |
| CN | 204271086 U | 4/2015 |
| JP | 2003-031353 A | 1/2003 |
| TW | 201409793 A | 3/2014 |
| WO | 2015/006276 A1 | 1/2015 |

OTHER PUBLICATIONS

The First Chinese Office Action dated Mar. 2, 2018; Appln. No. 201610125517.2.
The Third Chinese Office Action dated Mar. 12, 2019; Appln. No. 201610125517.2.

* cited by examiner

DISPLAY SUBSTRATE, MANUFACTURING METHOD THEREOF, AND DISPLAY PANEL

TECHNICAL FIELD

Embodiments of present invention relate to a display substrate, a manufacturing method thereof, and a display panel.

BACKGROUND

Organic light emitting diode (OLED), as a new generation of display device following liquid crystal display (LCD), has become one of research hotspots in recent years because of its advantages such as quick response, plentiful colors, lower power consumption, and wider viewing angle.

However, considering a difference in refractive indexes between an organic luminescent material (1.7-1.8), a substrate (1.5) in the OLED and the air (1.0), the light will be subjected to, in a waveguide mode, a total reflection between a luminescent layer and a transparent electrode as well as a total reflection in the glass substrate, which may cause light loss; in addition, part of the light will be lost, in a surface plasma mode, at a surface of the electrode. Therefore, actually, only about 20% of the light can be emitted into the air. To improve light extraction efficiency, it usually disposes a scattering means or a lens at an outer surface of the substrate so as to extract the light trapped in the glass, which, however, may cause halo effect and thus is only suitable for lighting but cannot meet requirements of display technology.

SUMMARY

Embodiments of the present invention provide a display substrate, a manufacturing method thereof, and a display panel, which can improve the luminous efficiency and hence the display effect of the display device.

In order to achieve the objective above, the embodiments of the present invention utilize technical solutions as below.

On one aspect, a display panel is provided, comprising: a glass substrate; plural sub-pixels; and plural light extraction modules disposed on the glass substrate at plural regions in one-to-one correspondence with the plural sub-pixels; wherein each of the light extraction modules has a hemisphere-shaped groove structure.

On another aspect, a manufacturing method of display panel is provided, comprising: performing a patterning process on the glass substrate to form plural light extraction modules each having a hemisphere-shaped groove structure; coating a macromolecule organic material onto the hemisphere-shaped groove structure of each of the light extraction modules by utilizing a spin coating process; performing a chemical vapor deposition (CVD) process on the glass substrate having been subjected to the spin coating process so as to form an insulating layer; and performing an evaporation process on the glass substrate formed with the insulating layer so as to form plural sub-pixels in one-to-one correspondence with the plural light extraction modules.

On yet another aspect, a display device is provided, comprising the above-mentioned display panel.

BRIEF DESCRIPTION OF THE DRAWINGS

Hereafter, the embodiments of the present invention will be descried in detail with reference to the accompanying drawings, so as to make those skilled in the art understand the present invention more clearly, wherein.

DETAILED DESCRIPTION

Hereafter, the technical solutions of the embodiments of the present disclosure will be described in a clear and complete way in connection with the drawings related to the embodiments of the present disclosure. It is obvious that the described embodiments are just a part but not all of the present disclosure. Based on the described embodiments of the present disclosure, those ordinarily skilled in the art can obtain other embodiment(s), without any inventive work, which come(s) within the scope sought for protection by the present disclosure.

Unless otherwise defined, the technical terminology or scientific terminology used herein should have the same meaning as commonly understood by one of ordinary skill in the art to which this invention belongs. Terms used in the present description and claims such as "first", "second" and so on are only used for distinguishing different components, and cannot be construed as indicating or implying sequence, amount and relative importance. Likewise, a term "a," "an," or "the" does not indicate limitation in number, but specifies the presence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly The embodiments of the present invention provide a display substrate, as illustrated in FIG. 1, comprising a glass substrate 01, plural sub-pixels 02, and plural light extraction modules 03 which are disposed in one-to-one correspondence with the plural sub-pixels 02; wherein the plural light extraction modules 03 are located within regions on the glass substrate 01 corresponding to the plural sub-pixels 02, respectively, and each of the light extraction modules 03 has a hemisphere-shaped groove structure.

Figure 1:
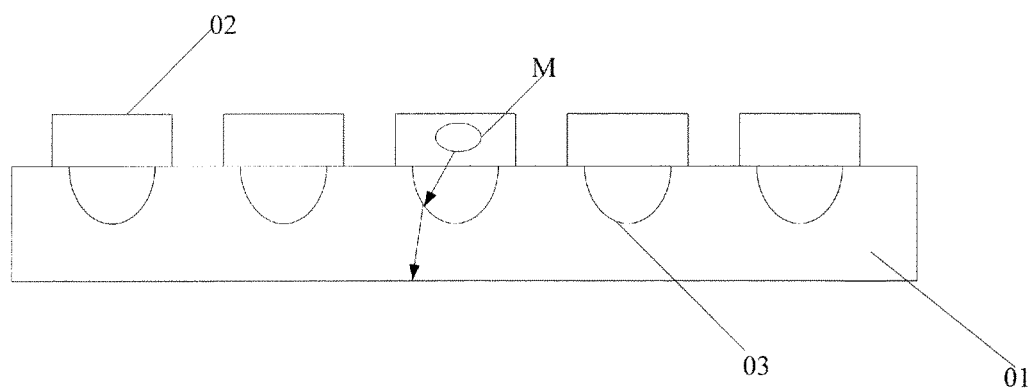
FIGS. 1 and 2 are schematically structural views illustrating a display substrate provided by an embodiment of present invention, respectively.

In the above display substrate provided by the embodiment of present invention, by arranging the light extraction modules on the glass substrate in one-to-one correspondence with the sub-pixels, that is, by manufacturing a hemisphere structure with a higher refractive index on the glass substrate corresponding to each of the sub-pixels, it is possible to reduce a refraction angle of the light incident onto the glass substrate after passing through the hemisphere-shaped light extraction module emitted from a luminous region M of each of the sub-pixels, as illustrated in FIG. 1; this allows more light to exit. Specifically, according to a refractive index formula of $n1 \sin \theta1 = n2 \sin \theta2$, when the light emitted from each of the sub-pixels passes through the hemisphere-shaped light extraction module with a higher refractive index and reaches the glass substrate with a lower refractive index, it turns out that the greater the refractive index $n2$ of the material of the light extraction module is, the smaller the refraction angle $\theta2$ of the light incident onto the glass substrate after passing through the hemisphere-shaped light extraction module will be, as compared with the refraction angle θ1 of the luminous region M of the sub-pixel, which allows more light to be extracted to the outside of the devices; in this way, it is possible to improve the luminous efficiency of the display substrate and hence the display effect of the display device.

In an example of the above display substrate provided by the embodiment of present invention, each of the light extraction modules 03 has a hemisphere diameter smaller than a dimension of the corresponding sub-pixel 02. By setting the hemisphere diameter of the light extraction module to be smaller than the dimension of the corresponding sub-pixel, the light emitted from the sub-pixel will be converged by means of the light extraction module with a smaller hemisphere diameter, so as to converge part of the light which is diverged during the transmitting process, thereby eliminating an occurrence of pixel blur In an example of the above display substrate provided by the embodiment of present invention, the sub-pixel 02 can be an organic electroluminescent device. The organic electroluminescent device comprises red, green, and blue organic electroluminescent devices; wherein the red organic electroluminescent device and the blue organic electroluminescent device correspond to a light extraction module 03 having a hemisphere diameter of 10 μm; and the green organic electroluminescent device corresponds to a light extraction module 03 having a hemisphere diameter of 8 μm.

According to the embodiments of the present invention, the hemisphere diameter of the light extraction module 03 needs to be smaller than the dimension of the corresponding sub-pixel 02, but cannot be too small to extract the diverged light; furthermore, the sub-pixels 02 of different colors will be different in dimensions, for example, the red and blue pixels generally have a dimension of 12 μm, and the green pixels generally have a dimension of 10 μm. Therefore, in an example of the above display substrate provided by the embodiment of present invention, the hemisphere diameters of the light extraction modules 03 corresponding to the red and blue pixels can be set as 10 μm, while the hemisphere diameter of the light extraction module 03 corresponding to the green pixel can be set as 8 μm.

In an example of the above display substrate provided by the embodiment of present invention, the hemisphere-shaped groove structure of the light extraction module 03 is filled with macromolecule organic materials therein. The macromolecule organic material is advantageous in its higher refractive index and higher transmittance, and can provide the light extraction module with a higher refractive index when used to fill the hemisphere-shaped groove structure. The greater the refractive index of the light extraction module is, the smaller the refraction angle of the light incident onto the glass substrate after passing through the light extraction module from the sub-pixel; in this way, more light can be extracted to the outside of the device.

In an example of the above display substrate provided by the embodiment of present invention, the macromolecule organic material can be polyethylene naphthalate (PEN). The polyethylene naphthalate has a refractive index of 1.8, and belongs to higher refractive index material; by manufacturing the light extraction module using polyethylene naphthalate, it is possible to improve the luminous efficiency of the display substrate and meet the requirement of the display technology. Of course, in other examples, other macromolecule organic materials that meet the requirements can also be utilized to manufacture the light extraction module, which is not particularly defined herein.

Figure 2:
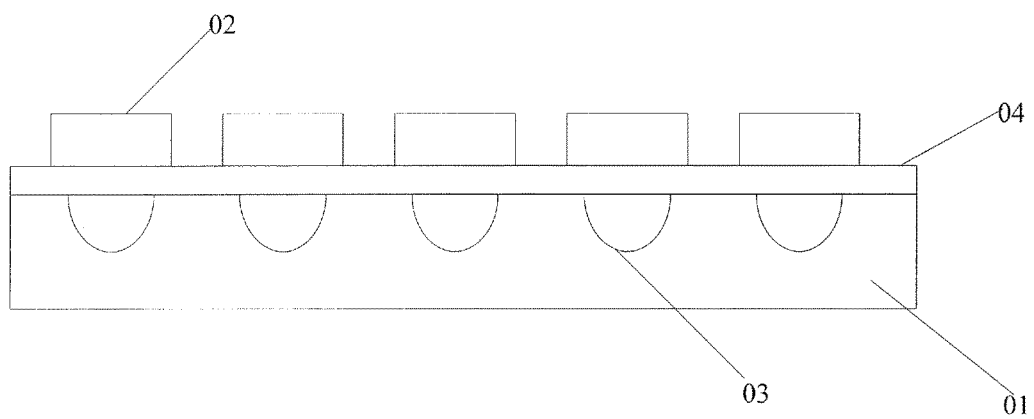

In an example of the above display substrate provided by the embodiment of present invention, as illustrated in FIG. 2, the display substrate can further comprise an insulating layer 04 located between the glass substrate 01 and each of the sub-pixels 02. For example, the insulating layer can be an insulating layer which has a higher refractive index and is high temperature resistant and transparent, thus such an insulating layer can meet the technology requirement of forming each of the sub-pixels through evaporation process without influencing the light transmittance.

In an example of the above display substrate provided by the embodiment of present invention, the material of forming the insulating layer 04 can be silicon nitride which has a refractive index greater than 1.8 and belongs to higher refractive index material. Of course, in other examples, other materials that have higher refractive index and higher transmittance or that are higher temperature resistant can also be utilized to manufacture the insulating layer, e.g., silicon oxide, without particularly defining herein.

According to the embodiment of the present invention, a thickness of the insulating layer 04 needs to meet the technology requirement without influencing the light transmittance. In an example of the above display substrate provided by the embodiment of present invention, the thickness of the insulating layer 04 can be 1 μm. Of course, in other examples, the thickness can be adjusted according to requirements and designs of the product, without particularly defined herein.

Figure 3:
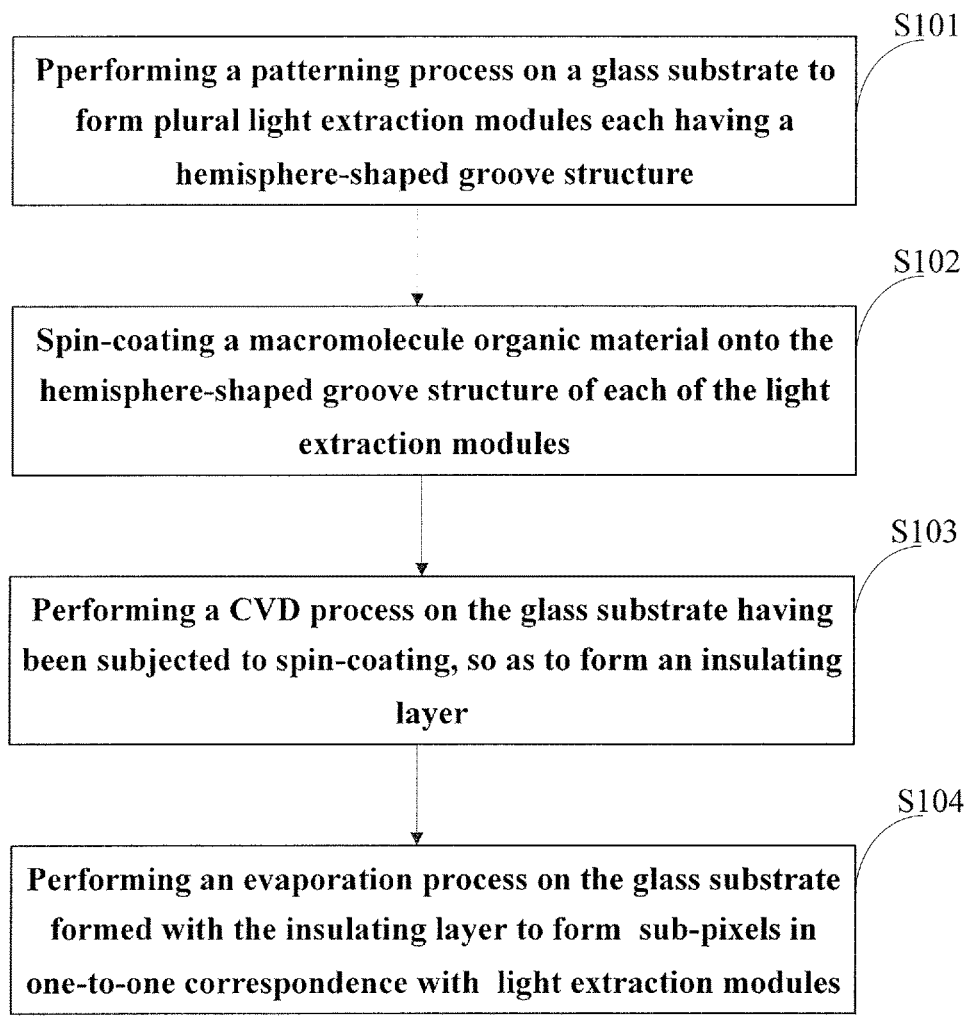
FIGS. 3 and 4 are flow charts illustrating a manufacturing method of the display substrate provided by the embodiment of present invention, respectively.

Based on the same inventive concept, embodiments of the present invention further provide a manufacturing method of the above display substrate. As illustrated in FIG. 3, the manufacturing method can comprise following steps S101-S104.

S101, performing a patterning process on a glass substrate to form plural light extraction modules each having a hemisphere-shaped groove structure;

S102, spin-coating a macromolecule organic material onto the hemisphere-shaped groove structure of each of the light extraction modules;

S103, performing a chemical vapor deposition process on the glass substrate having been subjected to spin-coating, so as to form an insulating layer; and S104, performing an evaporation process on the glass substrate formed with the insulating layer, so as to form plural sub-pixels disposed in one-to-one correspondence with the plural light extraction modules.

According to the embodiment of the present invention, by manufacturing the plural light extraction modules each having a hemisphere structure and a higher refractive index on the glass substrate in one-to-one correspondence with the plural sub-pixels, the refraction angle of the light that is emitted from each of the sub-pixels and incident onto the glass substrate can be decreased, so that more light can be emitted out; in this way, it is possible to improve the luminous efficiency of the display substrate and hence the display effect of the display device.

Figure 4:
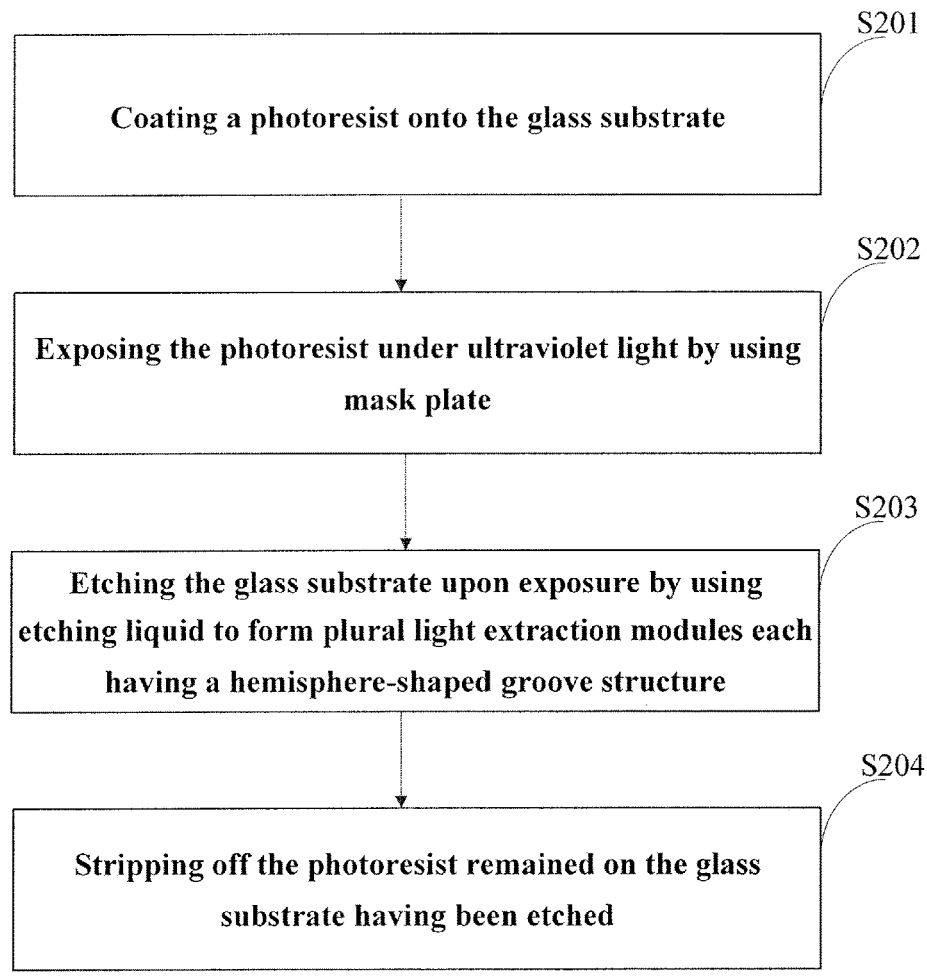

In an example of the above manufacturing method provided by the embodiment of present invention, as illustrated in FIG. 4, the step S101 can comprise sub-steps as below.

S201, coating a photoresist onto the glass substrate;

S202, exposing the photoresist under ultraviolet light by using a mask plate;

S203, etching the glass substrate upon exposure by using etching liquid to form the plural light extraction modules each having a hemisphere-shaped groove structure;

S204, stripping off the photoresist remained on the glass substrate having been etched.

Hereinafter an example of the above manufacturing method of display substrate provided by the embodiment of present invention will be described in more details in conjunction with FIGS. 5-9.

Figure 5:
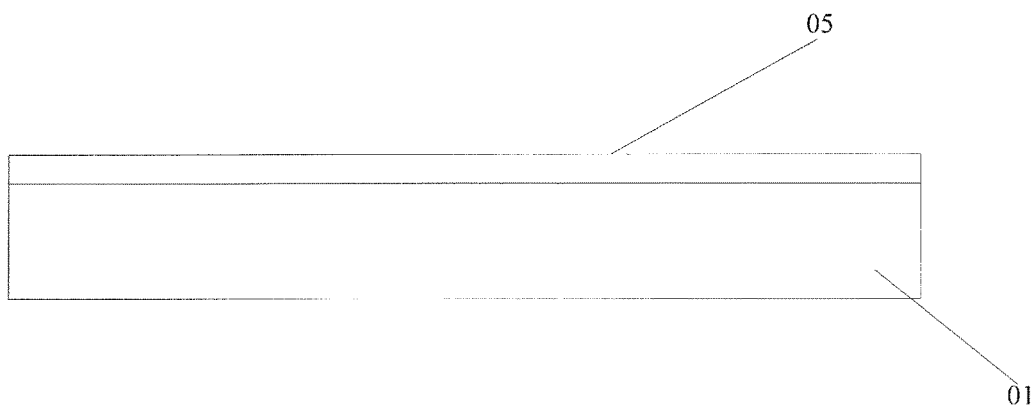
FIGS. 5 to 10 are schematic views of the manufacturing method of the display substrate provided by the embodiment of present invention respectively.
Figure 6:
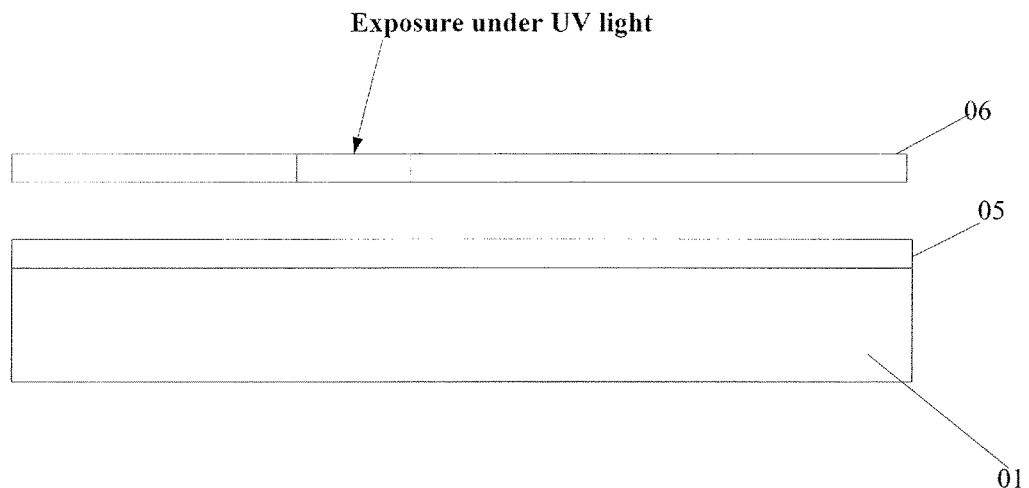
Figure 7:
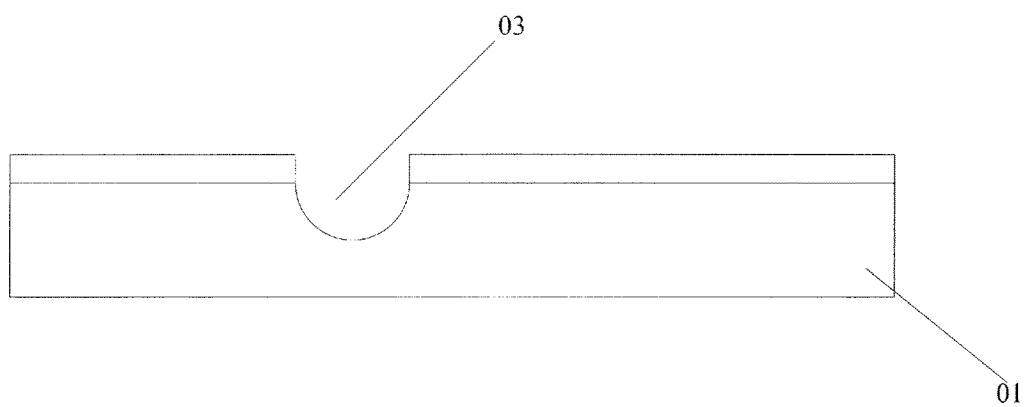
Figure 8:
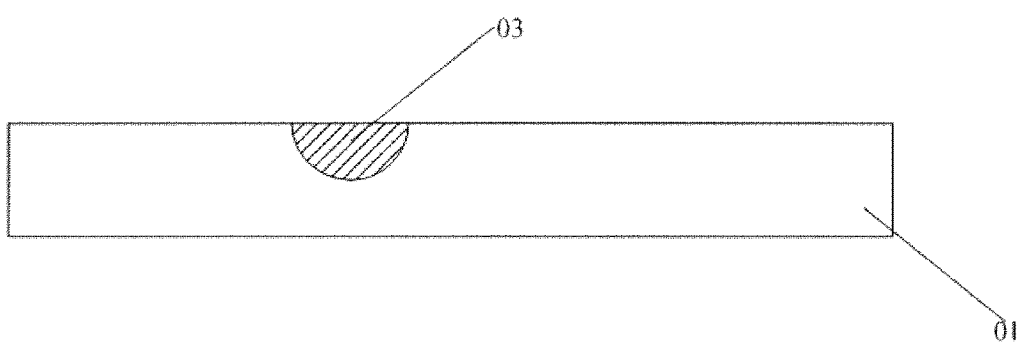
Figure 9:
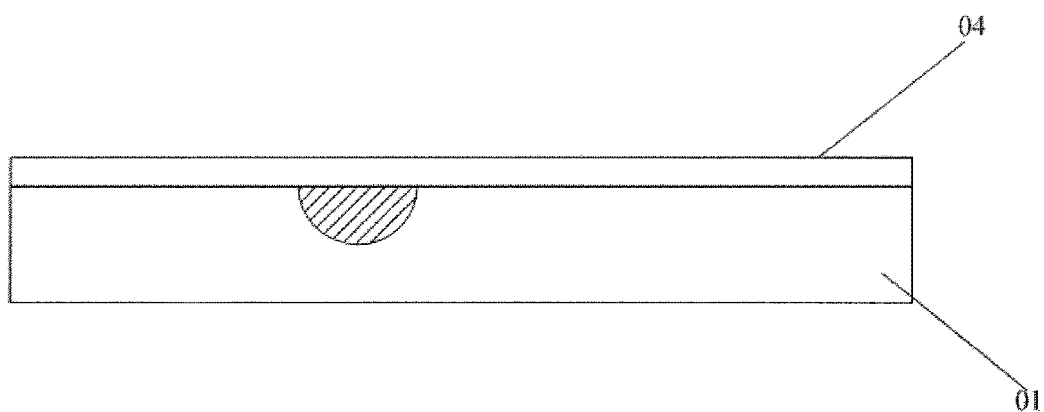
Figure 10:
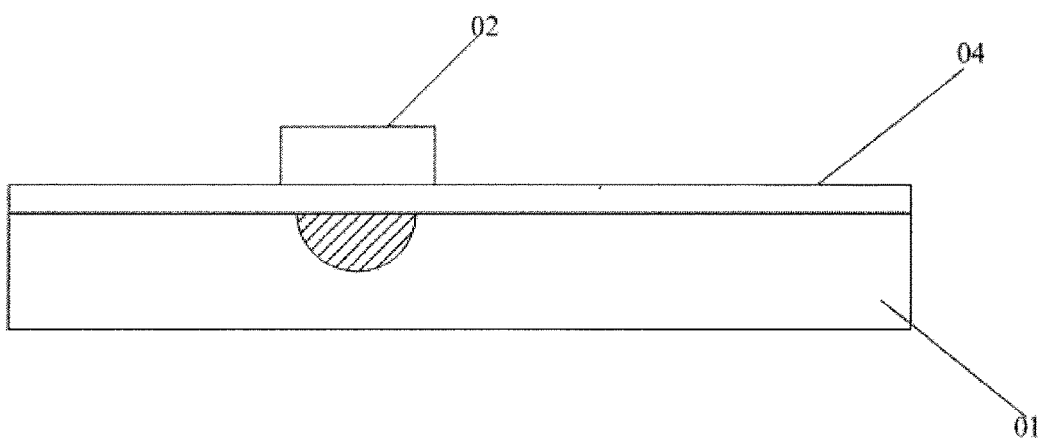

As illustrated in FIG. 5, a layer of photoresist 05 is coated onto a cleaned glass substrate 01 (which can be of ordinary glass or polyimide); then as illustrated in FIG. 6, the photoresist 05 is subjected to exposure under ultraviolet light by using a mask plate 06; then hydrofluoric acid etching liquid is used to etch the glass substrate 01 upon exposure to form a hemisphere-shaped, recessed structure as illustrated in FIG. 7, that is, a light extraction module 03 of a hemisphere-shaped groove structure is formed; then the photoresist remained after the etching process is stripped off, and an inner side of the resultant groove structure is coated with a macromolecule organic material (which can be polyethylene naphthalate) by a spin coating process, so as to create the light extraction module 03 as illustrated in FIG. 8. Consequently, the glass substrate 01 formed with the above light extraction module 03 is subjected to a chemical vapor deposition process so as to obtain the insulating layer 04 as illustrated in FIG. 9. Finally, as illustrated in FIG. 10, the glass substrate 01 formed with the above insulating layer 04 is subjected to an evaporation process so as to obtain plural sub-pixels 02 in one-to-one correspondence with the plural light extraction modules 03.

In the above manufacturing method of display substrate provided by the embodiment of present invention, the processes of exposure, etching, deposition and evaporation as used are all mature technologies well-known to those skilled in the art, and hence will be omitted with detailed description thereof. In an example of the above manufacturing method provided by the embodiment of present invention, the resultant light extraction modules each have a hemisphere diameter smaller than the dimension of the corresponding sub-pixel 02. By setting the hemisphere diameter of the light extraction module to be smaller than the dimension of the corresponding sub-pixel, the light emitted from each of the sub-pixels will be converged by means of the light extraction module with smaller hemisphere diameter; in this way, part of the light diverged during transmitting process can be converged so as to eliminate the occurrence of pixel blur.

In a first example of the above manufacturing method provided by the embodiment of present invention, each of the sub-pixels 02 formed by means of the evaporation process is an organic electroluminescent device which comprises red, green, and blue organic electroluminescent devices; wherein the red organic electroluminescent device and the blue organic electroluminescent device correspond to a light extraction module 03 having a hemisphere diameter of 10 µm; and the green organic electroluminescent device corresponds to a light extraction module 03 having a hemisphere diameter of 8 µm.

According to the embodiments of the present invention, the hemisphere diameter of the light extraction module 03 needs to be smaller than the dimension of its corresponding sub-pixel 02, but cannot be too small to extract the diverged light; moreover, the sub-pixels 02 of different colors can have different dimensions, for example, the red and blue sub-pixels generally have a dimension of 12 µm, and the green sub-pixel generally has a dimension of 10 µm. Therefore, in an example of the above manufacturing method provided by the embodiment of present invention, the hemisphere diameters of the light extraction modules 03 corresponding to the red and blue sub-pixels can be set as 10 µm, while the hemisphere diameter of the light extraction module 03 corresponding to the green sub-pixel can be set as 8 µm.

Based on the same inventive concept, the embodiments of the present invention further provide a display panel comprising the above display substrate.

The display panel provided by the embodiment of present invention can be applied to mobile phone, tablet computer, television, display device, notebook computer, digital photo frame, navigator and any other similar products or components having a display function. The principle utilized by the display panel to solve the technical problem thereof is similar with that of the display substrate, thus the implementations of the display panel can refer to that of the display substrate without repeating herein.

As above, the embodiments of the present invention provide a display substrate, a manufacturing method thereof, and a display panel. The display substrate comprises a glass substrate, plural sub-pixels, and plural light extraction modules disposed in one-to-one correspondence with the plural sub-pixels; wherein each of the light extraction modules is located within a region on the glass substrate corresponding to one of the sub-pixels and has a hemisphere-shaped groove structure. By manufacturing plural light extraction modules each having a hemisphere structure and also a higher refractive index on the glass substrate in one-to-one correspondence with plural sub-pixels, the refraction angle of the light that is emitted from each of the sub-pixels and incident onto the glass substrate can be decreased, so that more light can be emitted out; in this way, it is possible to improve the luminous efficiency of the display substrate and hence the display effect of the display device.

The foregoing are merely specific embodiments of the invention, but not limitative to the protection scope of the present disclosure. Therefore, the protection scope of the invention should be defined by the accompanying claims.

The present disclosure claims the benefits of Chinese patent application No. 201610125517.2, which was filed on Mar. 4, 2016 and is fully incorporated herein by reference as part of this application.

What is claimed is:

1. A manufacturing method of a display substrate, the display substrate comprising: a glass substrate; plural sub-pixels; and plural light extraction modules disposed on the glass substrate at plural regions in one-to-one correspondence with the plural sub-pixels; wherein each of the light extraction modules has a hemisphere-shaped groove structure, the method comprising:
performing a patterning process on the glass substrate to form plural light extraction modules each having a hemisphere-shaped groove structure;
coating a macromolecule organic material onto the hemisphere-shaped groove structure of each of the light extraction modules by utilizing a spin coating process;
performing a chemical vapor deposition (CVD) process on the glass substrate having been subjected to the spin coating process so as to form an insulating layer; and
performing an evaporation process on the glass substrate formed with the insulating layer so as to form plural sub-pixels in one-to-one correspondence with the plural light extraction modules.

2. The manufacturing method according to claim 1, wherein performing a patterning process on the glass substrate to form plural light extraction modules each having a hemisphere-shaped groove structure comprises:
coating a photoresist onto the glass substrate;

exposing the photoresist under ultraviolet light by using a mask plate;

etching the glass substrate upon exposure by using etching liquid to form the plural light extraction modules each having a hemisphere-shaped groove structure; and stripping off the photoresist remained on the glass substrate having been etched.

3. The manufacturing method according to claim 1, wherein the light extraction module is filled with a material having a higher refractive Index than a refractive index of the glass substrate and has a hemisphere diameter smaller than a dimension of the corresponding sub-pixel in a direction parallel to the glass substrate, so that in a layer where the plural light extraction modules are located, no region corresponding to a space between adjacent sub-pixels contains the material having a higher refractive Index.

4. The manufacturing method according to claim 1, wherein the macromolecule organic material is polyethylene naphthalate (PEN).

5. The manufacturing method according to claim 1, wherein a material of forming the insulating layer is silicon nitride.

6. The manufacturing method according to claim 2, wherein the light extraction module is filled with a material having a higher refractive Index than a refractive index of the glass substrate and has a hemisphere diameter smaller than a dimension of the corresponding sub-pixel in a direction parallel to the glass substrate, so that in a layer where the plural light extraction modules are located, no region corresponding to a space between adjacent sub-pixels contains the material having a higher refractive Index.

7. The manufacturing method according to claim 2, wherein the macromolecule organic material is polyethylene naphthalate (PEN).

8. The manufacturing method according to claim 2, wherein a material of forming the insulating layer is silicon nitride.

\* \* \* \* \*